March 19, 1963 R. L. ANDERSON 3,082,283

RADIANT ENERGY RESPONSIVE SEMICONDUCTOR DEVICE

Filed Nov. 25, 1959

INVENTOR
RICHARD L. ANDERSON

BY Alvin J. Riddles
ATTORNEY

United States Patent Office 3,082,283

Patented Mar. 19, 1963

3,082,283
RADIANT ENERGY RESPONSIVE SEMICONDUCTOR DEVICE

Richard L. Anderson, Poughkeepsie, N.Y., assignor to International Business Machines Corporation, New York, N.Y., a corporation of New York Filed Nov. 25, 1959, Ser. No. 855,393
3 Claims. (Cl. 136—89)

This invention relates to semiconductor devices and in particular to the fabrication of improved radiant energy response semiconductor devices.

In semiconductor devices for use in radiant energy responsive applications, the major criterion is that the maximum number of hole-electron pairs produced in the semiconductor material by the effect of the radiant energy can contribute as carriers to an output current exhibited by the device. In photosensitive applications, the device has generated within it one hole-electron pair for each photon of light absorbed. To this end, structures for use in radiation responsive applications are built such that hole-electron pairs generated in the semiconductor material occur within a diffusion length of a PN junction so that the maximum number of these carriers can reach that junction within their lifetime. This criterion puts severe limitations on the carrier lifetime of the semiconductor material from which the photosensitive device is made and also on the internal dimensions of the device. These items determine the distance a carrier must and can travel to reach a point where it can contribute to an output current.

Radiation responsive devices generally have a PN junction positioned in a body of a semiconductor material which has the properties of high carrier mobility and long lifetime. The properties of high mobility and long lifetime in semiconductor material are very difficult to control so that efficient radiant energy responsive devices heretofore in the art have been produced only by very complicated technology.

What has been discovered is a highly sensitive radiant energy responsive semiconductor device and method of providing it, wherein sensitivity to photo generated carriers is provided by a combination of the physical properties of the semiconductor materials involved and their structure so that a highly efficient device is made in a relatilvely simple manner.

It is an object of this invention to provide an improved radiant energy responsive semiconductor device.

It is another object of this invention to provide a method of fabricating an improved radiant energy responsive semiconductor device.

It is an object of this invention to provide an improved photosensitive semiconductor device.

It is another object of this invention to provide a method of fabricating an improved photosensitive semiconductor device.

It is another object of this invention to provide an improved germanium-gallium arsenide semiconductor device.

It is another object of this invention to provide an improved method of fabrication of an NPN semiconductor structure.

The foregoing and other objects, features, and advantages of the invention will be apparent from the following more particular description of a preferred embodiment of the invention as illustrated in the accompanying drawings.

The invention is the fabrication of a radiant energy responsive semiconductor device through the deposition of a relatively low energy gap semiconductor material on for example an N type, high resistivity intermetallic compound type, wide energy gap, semiconductor material. The resulting device is an NPN structure in which the distance from the P region to the N region through the PN junction is very long by comparison to the junctions previously available in the art. Such a PN junction is known as a wide junction.

Figure 1:
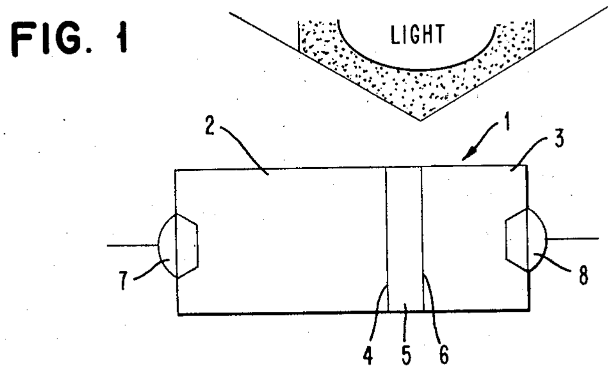
FIGURE 1 is a schematic view of the radiant energy responsive semiconductor device of this invention.

Referring now to FIGURE 1, a sketch of the radiant energy responsive semiconductor device of the invention is provided. In FIGURE 1, a monocrystalline semiconductor body 1 is provided comprising a region of N type relatively high resistivity, intermetallic compound type, wide energy gap, semiconductor material 2, on which has been epitaxially added, a region 3 of an N type, relatively low energy gap, semiconductor material.

It has been found that when the region 3 is added to the region 2 in an epitaxial manner, the conductivity type of the N type wide energy gap intermetallic compound type region 2 changes in the intermetallic compound near the interface of the original region 2 from N extrinsic conductivity type to P extrinsic conductivity type and a wide PN junction 4 is formed. The wide junction 4 joins a region 5 of opposite conductivity type and of the same wide energy gap intermetallic compound type semiconductor material as the region 2. In the event that conductivity type determining impurities are added to the low energy gap semiconductor material 3, a second PN junction 6 may be formed. Alloyed ohmic contacts 7 and 8 are made to regions 2 and 3 respectively to provide circuit connections for later use.

As a particular example, to bring the invention into proper perspective, the material 2 may be N type high resistivity gallium arsenide GaAs and the region 3 may be epitaxially vapor deposited N type germanium containing arsenic as a conductivity type determining impurity. When such a structure is formed, the region 5 occurs and has been found to be P type gallium arsenide, GaAs.

Figure 2:
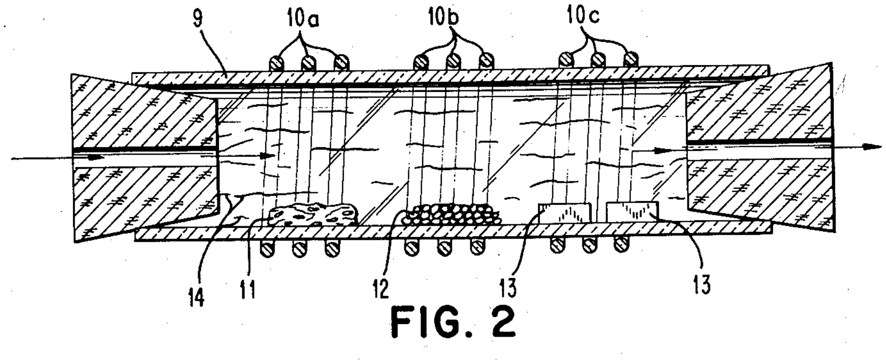
FIGURE 2 is a sketch illustrating the method of fabrication of the invention.

Referring next to FIGURE 2, a sketch is provided of an open tube vapor deposition process well known in the art, usable for producing the structure of the invention. In FIGURE 2, a refractory environment controlling container such as a quartz tube 9 is provided having heat sources at discrete locations positioned around it. The heat sources may be for example, inductive or resistive heating elements, and in the figure, are shown in three locations, defined by heating elements **10*a*, 10*b*, and 10*c*. Within the tube 9, a source of a transport element 11, such as for example iodine, is provided in a first temperature location under the coil 10*a*. A source of a low energy gap semiconductor material 12, for example germanium, is provided in a second temperature location under the coil 10*b*. The high energy gap semiconductor material such as gallium arsenide is in monocrystalline form to serve as a substrate 13 and is located in the third temperature location under the coil 10*c*. A steady flow of a neutral or reducing atmosphere such as hydrogen is provided flowing in the direction of the arrow through the furnace. In the presence of sufficient heat, a vapor is formed inside the furnace which is a combination of the transport element, the depositing semiconductor material 12 and the hydrogen. This vapor is shown as element 14**.

Epitaxial deposition occurs when the deposited material retains the same periodicity of atomic structure as the substrate material. The deposition involves a pyrolytic type of reaction and occurs when the region **10*c* is held at a different temperature from that of the remainder of the tube 9**.

In order to aid in understanding and practicing the invention and to set forth a proper perspective for the magnitude of the values involved, the following example is set forth of actual values involved in a process for fabricating the structure of FIGURE 1 conducted in a container as shown in FIGURE 2.

Germanium is epitaxially deposited on gallium arsenide by providing in an environment controlling container such as 9 in FIGURE 2, N type high resistivity gallium arsenide substrates 13 each in single crystalline forms. The tube 9 has a diameter of approximately 5 centimeters and a length of approximately 70 centimeters, it is wound with three adjacent windings 10_a_, 10_b_ and 10_c_ of Nichrome wire. Current through these windings is adjusted to give the desired temperature in each of the regions thereunder so that the temperature is sufficiently high in the regions 10_a_ and 10_b_ to vaporize the compound of the transport element 11 and the semiconductor 12 and the lowest temperature in the system is in the region of the substrate 13. Dry hydrogen gas enters the tube at one end and flows past the regions under coils 10_a_, 10_b_, and 10_c_ and out the other end of the tube.

The tube 9 is provided with the reacting ingredients as follows:

100 grams of iodine serving as the transport element are positioned under the heating element 10_a_, and 100 grams of germanium containing arsenic as a conductivity type determining impurity are positioned under the heating element 10_b_. The resistivity of the germanium is approximately 5 ohm centimeters. The gallium arsenide substrates 13 contain a relatively small net quantity of N conductivity type determining impurities such that the substrates exhibit a high resistivity. With the iodine 11 and germanium 12 unheated, that is with no heat supplied from heating elements 10_a_ and 10_b_, the gallium arsenide substrates 13 are heated to about 700° C. by applying heat to element 10_c_ while hydrogen passes through the tube. This is done in order that the hydrogen will remove any oxides which might be present on the gallium arsenide substrates 13. After approximately 10 minutes of this treatment the temperature of the gallium arsenide substrates 13 is reduced to about 450° C. by reducing the power applied to the element 10_c_ while the temperature of the germanium 12 and iodine 11 zones is raised to about 600° C. and 90° C. respectively by proper application of power to heating elements 10_a_ and 10_b_. The temperature difference between the source 12 and the substrates 13 operates to decompose a compound of germanium and iodine and to deposit germanium epitaxially on the gallium arsenide substrates 13. A hydrogen gas flow of 2 cubic feet per hour, is generally employed. While the exact chemical reaction has not definitely been established, it is considered that the iodine forms gaseous iodine in the region under the heating element 10_a_ and that the gaseous iodine combines with the source germanium 12 to form the compound $GeI_4$ which in turn again reacts with the source germanium to form $GeI_2$ in the region 10_b_. In turn in the region 10_c_, held at a different temperature, the $GeI_2$ decomposes into $GeI_4$ and free germanium which epitaxially deposits on the substrate.

Figure 3:
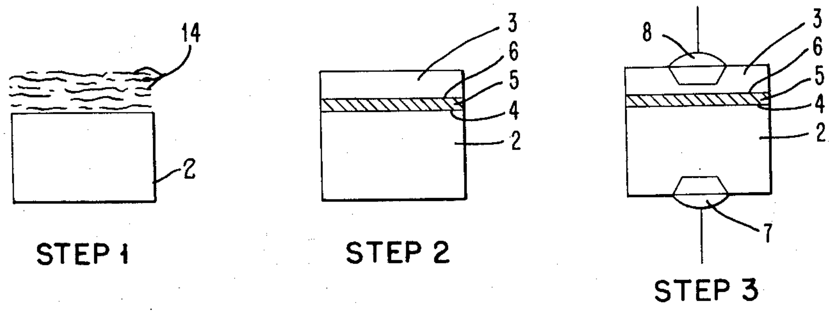
FIGURE 3 is a flow chart illustrating the steps in fabricating the invention.

Referring next to FIGURE 3, a flow chart is provided of the steps involved in which reference numerals are employed corresponding to like elements in FIGURES 1 and 2. In FIGURE 3, step 1 a high resistivity, high energy gap intermetallic compound type substrate 2 is subjected to a vapor 14 from which is epitaxially deposited, a low energy gap semiconductor.

The compound shown as vapor 14 decomposes to produce free low energy gap semiconductor material which joins the substrate 2 in the same crystalline orientation and atomic periodicity of structure as the substrate so that a single monocrystal of the two materials is produced.

Referring next to step 2, an illustration is provided of the unique behavior of the invention. It has been found that as the low energy gap N conductivity type semiconductor material 3, is deposited on the substrate 2, which is of high resistivity, high energy gap intermetallic compound type semiconductor material, N conductivity type in this illustration, the semiconductor material of the orignial substrate becomes progressively less N type as the surface upon which the deposit was made is approached. The region of the original substrate near the surface on which the deposit was made becomes P type and a PN junction 4 and a P type region 5 are provided. Since opposite conductivity type determining impurities are introduced from the vapor 14 in step 1, into the deposited semiconductor material 3, in a concentration sufficient to determine conductivity type, a second PN junction 6 is formed at the surface of the original substrate material.

Where the low energy gap semiconductor material that is deposited has a lower net donor or acceptor concentration than the high energy gap intermetallic compound type semiconductor material immediately adjacent, the low energy gap, high energy gap contact will be of low resistance. In the particular example illustrated in connection with this invention where the low energy gap semiconductor material is germanium and the high energy gap semiconductor material is gallium arsenide GaAs, this can be achieved, referring to FIGURE 2, by using high purity intrinsic germanium as a source material in the container 9 as element 12.

Referring next to step 3, of FIGURE 3, an ohmic contact 7 is made by alloying with a compatible alloy which for example, may be 98% indium and 2% tellurium. The alloy is fused into the high energy gap intermetallic compound type semiconductor material 2 where the tellurium serves as an N conductivity type impurity insuring a good ohmic contact. A second ohmic contact 8 is made by alloying into the germanium using for an example an alloying material such as tin.

What has been described is a radiant energy responsive semiconductor device and process of making it wherein one region of the semiconductor structure involves a wide energy gap, N type high resistivity intermetallic compound extrinsic conductivity type semiconductor material, having a wide PN junction separating one region of the wide energy gap semiconductor material from an opposite conductivity type region of the wide energy gap semiconductor material and having another PN junction separating a region of low energy gap semiconductor material of the original extrinsic conductivity type. In this structure, a wide PN junction transition region is provided without requiring physical dimension control so that a large number of carriers generated when energy strikes the material can contribute to a photo current and most of the photo current is the result of carriers generated in the transition region.

The resulting device is a very sensitive photo diode because of the high resistivity material which gives a sharp difference between "dark" and "photo" currents. It has a wide transition region so that many photons are absorbed in the region. The wide transition region in turn results in a very small junction capacity. Further, the variation of capacity with voltage is low. Such a structure, made by epitaxially depositing germanium on gallium arsenide provides an easy structure with which to make a low resistance contact by the simple technique of alloying.

While the invention has been particularly shown and described with reference to a preferred embodiment thereof, it will be understood by those skilled in the art that various changes in form and detail may be made therein without departing from the spirit and scope of the invention.

What is claimed is:

1. A semiconductor device made by the process of forming on a body of N type high resistivity high energy gap intermetallic compound type semiconductor material, an epitaxially deposited region of low energy gap N type semiconductor material of the same conductivity type as said body, whereby a P conductivity type region is produced in said high energy gap body forming a wide PN junction with said high energy gap body, a first ohmic contact to said body and applying a second ohmic contact to said deposited region.

2. The semiconductor device of claim 2 wherein said body is N conductivity type gallium arsenide GaAs and said deposited region is N type germanium.

3. A radiation responsive semiconductor device made by the process of applying to a first region of high extrinsic resistivity intermetallic compound type semiconductor material, a second epitaxially deposited region of a lower energy gap semiconductor material having the same extrinsic resistivity type as said first region whereby a P conductivity type region is formed in said high resistivity material joining said high resistivity material at a wide PN junction and at least one circuit connecton to said device.

References Cited in the file of this patent

UNITED STATES PATENTS

| | | |
|---|---|---|
| 2,692,839 | Christensen et al. | Oct. 26, 1954 |
| 2,798,989 | Welker | July 9, 1957 |

FOREIGN PATENTS

| | | |
|---|---|---|
| 1,184,921 | France | Feb. 9, 1959 |